United States Patent [19]
Fassbender

[11] 3,996,612
[45] Dec. 7, 1976

[54] TEST CODE GENERATOR

[75] Inventor: Charles J. Fassbender, San Diego, Calif.

[73] Assignee: NCR Corporation, Dayton, Ohio

[22] Filed: July 7, 1975

[21] Appl. No.: 594,145

[52] U.S. Cl. .................................................. 360/40
[51] Int. Cl.$^2$ .......................................... G11B 5/02
[58] Field of Search .............................. 360/40, 51

[56] References Cited
UNITED STATES PATENTS

| 3,641,526 | 2/1972 | Bailey et al. | 360/51 |
| 3,821,798 | 6/1974 | Cannon | 360/51 |
| 3,864,735 | 2/1975 | Davis et al. | 360/51 |

*Primary Examiner*—Vincent P. Canney
*Attorney, Agent, or Firm*—J. T. Cavender; James H. Phillips; Edward A. Gerlaugh

[57] ABSTRACT

Apparatus for generating self-clocking data of a predetermind format simulating control information recorded on a dynamic magnetic medium storage device. The data generator includes means for simulating servo clock signals and encoding means for producing formatted data signals having jitter and phase relationship to the servo signals which are worst-case rather than random. The apparatus is utilized to test data recovery circuits independently of the storage device.

12 Claims, 6 Drawing Figures

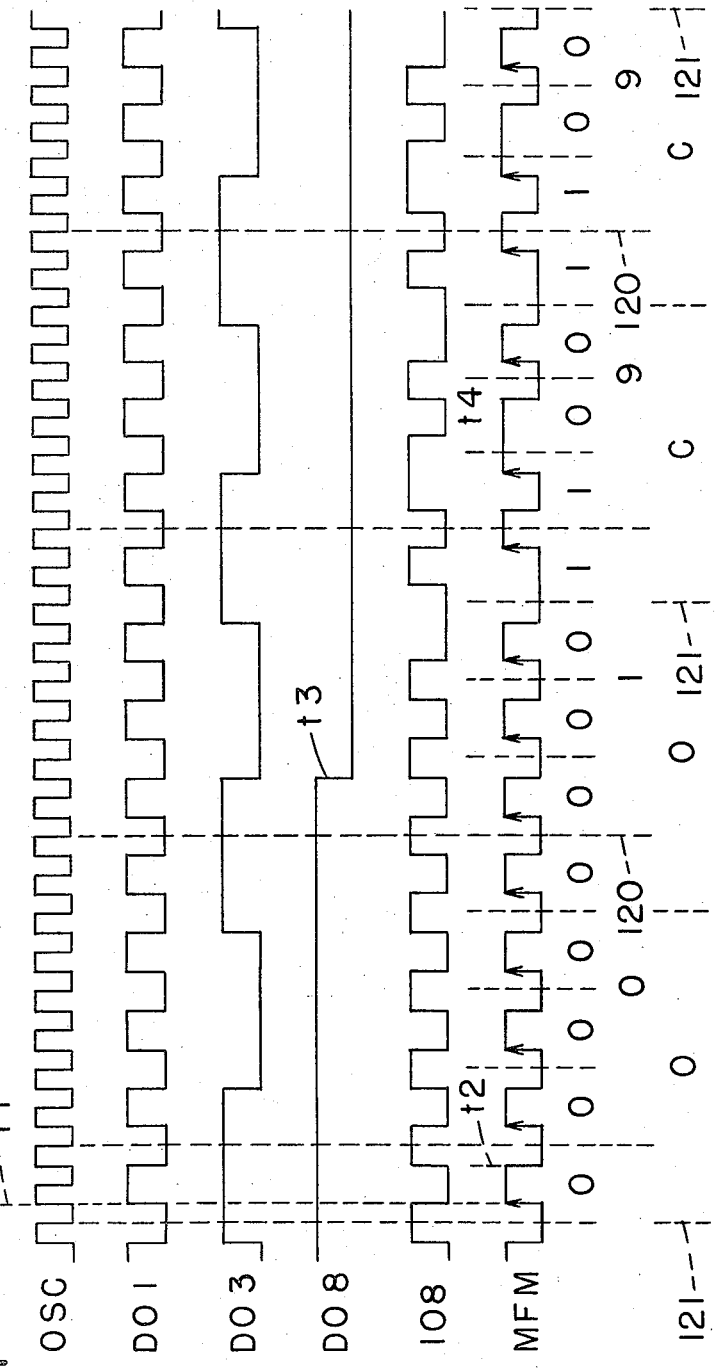
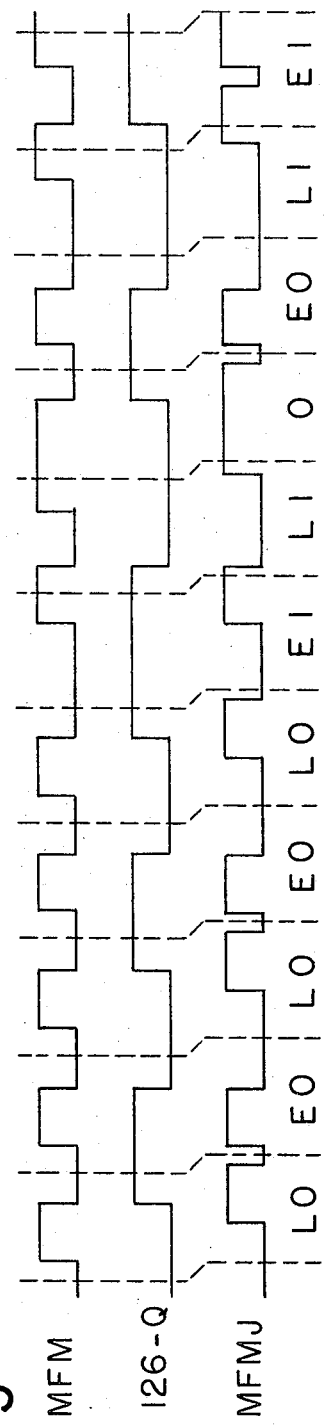
FIG. 4
FIG. 5

TEST CODE GENERATOR

CROSS REFERENCE

The present invention relates to my copending United States Patent Application Ser. No. 594,144, entitled "PLO Phase Detector and Corrector" which was filed on even date herewith and is assigned to the same assignee as the present invention.

BACKGROUND OF THE INVENTION

1. Field of the Invention

This invention relates to information storage and retrieval, and more particularly, to apparatus in a cyclic store control unit for generating a predetermined test code having a worst-case data pattern for testing the control unit circuits at a device interface.

Typical bulk memory subsystems having direct access storage devices such as magnetic disks include a computer driven controller, a disk drive system, a plurality of magnetic recording disks, and speed detection apparatus which may comprise a disk surface having servo timing marks recorded thereon. Other forms of speed detection apparatus such as a digital tachometer may be utilized. The timing marks are sensed and utilized to drive a clock signal generator into synchronization with the sensed timing marks to produce a series of clock signals. The servo derived clock signals are utilized in the store controller for write operations wherein the clock signals may be combined with data to be stored and recorded on one of the magnetic disks as a series of indicia or flux transitions representative of both the clock signals and the data. Data thus recorded with timing inherent therein is termed self-clocking data. The present invention is concerned with circuits for recovering self-clocking data.

During a read or data recovery operation the servo signals from the storage device are ignored and the clock signal generator is synchronized directly with the self-clocking data, which is sensed by a magnetic transducer from a selected storage device.

2. Description of the Prior Art

Many self-clocking modulation and coding techniques are used to improve the efficiency of magnetic medium devices and to minimize the problems attendant with extremely high bit densities. One such technique is termed modified frequency modulation (MFM). The use of MFM coding derives advantages over other types of codes such as diphase or phase encoding because the MFM code results in fewer flux transitions to represent the same data pattern. Recovered MFM encoded data exhibits an inherent phenomenon called random peak shift (in addition to a predictable peak shift) wherein the recovered data shifts in time by random amounts and direction. Mechanical and electronic design tolerances are critical at high bit densities; minute anomalies such as slight variations in speed of the magnetic medium, asymmetric read-head windings and non-uniform write-current waveform rise times, all contribute to the randomness of the peak shift or jitter. Accordingly, the prior art systems for recovering MFM encoded data required complex circuits with precision components to detect and correct the random peak shift, thereby reducing or eliminating the advantages gained.

Circuits for recovering self-clocking data are designed largely with commercially available integrated circuit modules such as the well known dual-in-line package (DIP). The modules contain circuits and logic elements having variable signal propogation delays, i.e., each delay through each circuit, although within guaranteed maxima and minima, may vary from circuit to circuit and from module to module. Accordingly, it has been the practice in the past to test and select specific modules for individual timing accuracy so that a number of interconnected modules will have more closely predictable signal propogation times. This is an expensive and time consuming procedure. Other prior art data recovery circuits utilize less precise modules with manually adjustable components for compensating for variations in signal propogation time. This technique requires removing the equipment from service periodically for testing and readjustment of the data recovery circuits by a service technician, utilizing a test data string recorded on a magnetic disk. In order to test the ability of data recovery circuits to compensate for random jitter without introducing additional error into the data stream, it is necessary to provide a test data string having no jitter or a known amount of jitter. Such test data strings have been provided in the past from special disks recorded with a high degree of precision. For example, the test data string recorded on the special disk may have a pattern of bits bearing a timed relationship to an ideal bit pattern wherein certain of the bits appear early or late by a known amount in relation to the ideal pattern. Such test disks are expensive to produce, and moreover, the method is device dependent, failing to eliminate errors which might be introduced by the disk drive.

SUMMARY OF THE INVENTION

It is, therefore, a primary object of my invention to provide a new and improved test data generator.

Another object of the invention is to provide new and improved apparatus in a cyclic store control unit for testing the control unit circuits at a device interface, which apparatus is storage-device independent.

It is another object of my invention to provide new and improved apparatus for generating a bit string with predetermined degradations for use in testing a circuit comprising interconnected standard logic element modules, without regard to individual gate delays of the interconnected modules.

It is a more specific object of my invention to provide new and improved apparatus for generating self-clocking data of a predetermined format simulating control information recorded on a dynamic magnetic-medium storage device.

These and other objects of my invention are achieved in accordance with the invention claimed by providing encoding logic in a control unit of a cyclic store subsystem driven by a timing means independent of direct access storage devices. Input signals from a counting means also driven by the timing means are utilized by the control logic to generate a predetermined bit string of MFM encoded data free of random jitter. A predetermined amount of jitter may be introduced into the bit string by delaying selected ones of the bits thereof in a delaying means.

BRIEF DESCRIPTION OF THE DRAWINGS

The invention is pointed out with particularity in the appended claims, however, other features of the invention will become more apparent and the invention will be best understood by referring to the following detailed description in conjunction with the accompanying drawings in which:

FIG. 4 is a timing diagram showing signal waveforms generated in practicing the present invention.

FIG. 5 is a diagram which shows the timing of the test data string.

DESCRIPTION OF THE PREFERRED EMBODIMENT

Figure 1A:
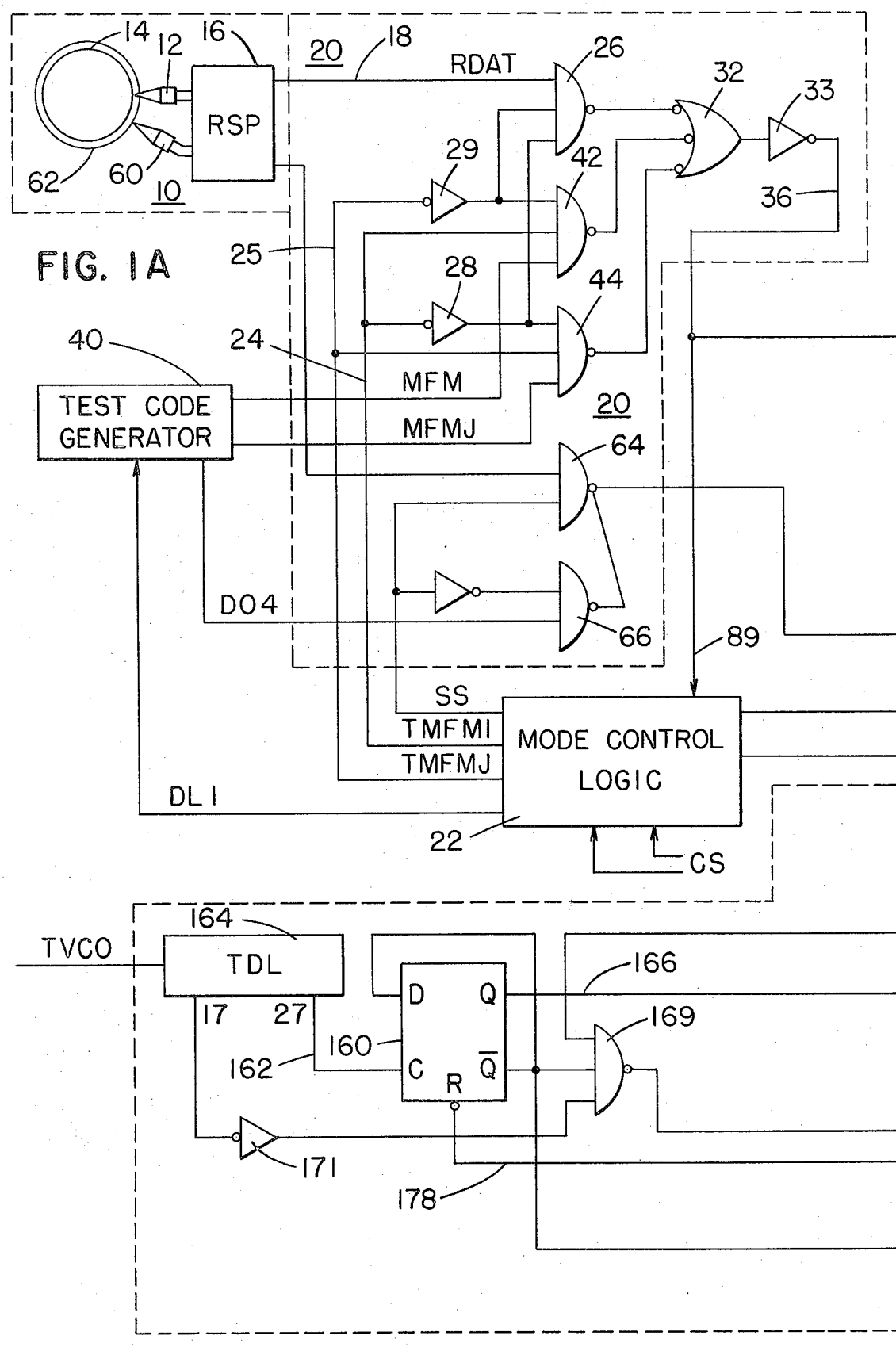
FIGS. 1A and 1B, when arranged side by side, form a logic diagram of data recovery circuits in a disk subsystem controller utilizing apparatus in accordance with the present invention.
Figure 1B:
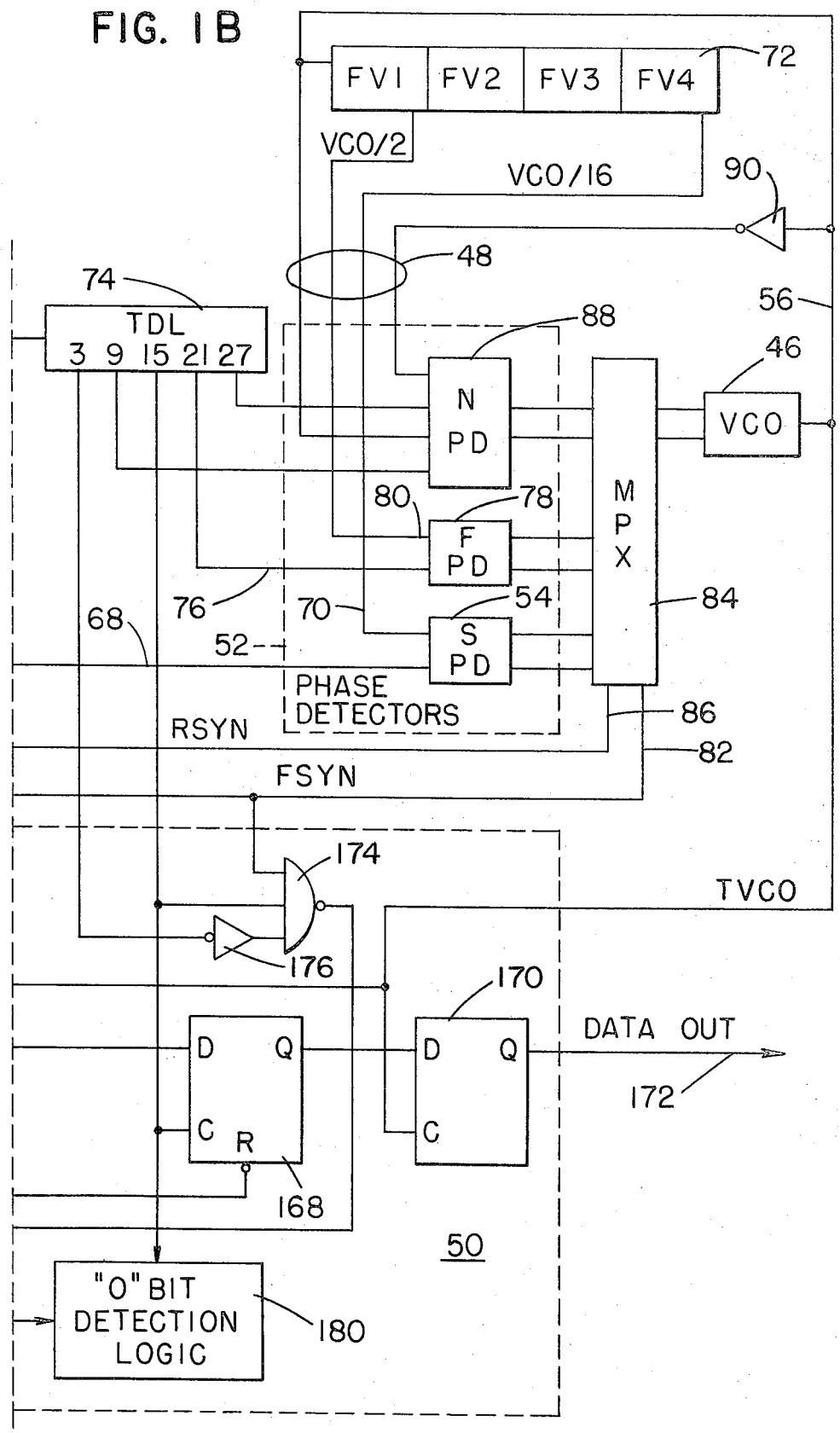
Figure 2:
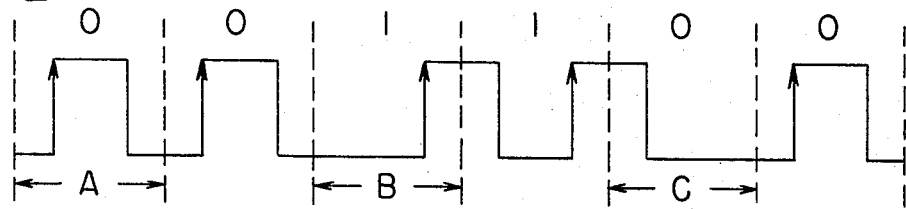
FIG. 2 is a waveform illustrating MFM encoding of data.

Referring now to the Figures by characters of reference, FIG. 1 shows digital data recovery circuits utilizing a preferred embodiment of the present invention. It is assumed that self-clocking data such as MFM encoded data is recovered from a direct access storage device 10 such as a magnetic disk unit. The digital data is represented by a series of flux transitions on a magnetic medium in motion with respect to an electromagnetic transducer 12. The transducer 12 senses the flux transitions on a data track 14 as occurring in relation to a series of time periods termed "cells" or "bit periods," each of which cells is divided into two equal time periods. MFM encoded data is defined herein as a representation of 1 binary digit by a flux transition occurring during the second half of a cell, and the other binary digit (0) by a flux transition of the same direction occurring during the first half of a cell, except when the other bit (0) follows the 1 bit, in which case the other bit (0) is represented by the absence of a flux transition during the corresponding bit period. FIG. 2 shows an MFM encoded (voltage) waveform having the bit pattern 001100. Cell boundries are represented by dashed lines. Cell A shows a positive excursion representative of a 0 flux transition occurring during the first half of the cell; cell B, a positive excursion during the second half of the cell representative of a 1 flux transition. Cell C represents a 0 bit following a 1 and therefore has no positive excursion during the bit period. The selection for illustration of both a positive excursion and a particular bit represented thereby is arbitrary.

The waveform of FIG. 2 is representative of MFM data detected by the transducer 12 from the data track 14, regenerated by a read signal processor (RSP) 16, and transferred as an RDAT signal to data selection circuits 20. The RSP 16 comprises pulse shapers and drivers which are well known in the art and do not form a part of my invention.

Mode control logic 22 in the storage controller generates test control signals TMFM1 and TMFMJ which are transferred to the data selection circuits 20, respectively, via lines 24 and 25. When both the TMFM1 and TMFMJ signals are disabled during normal data recovery operations, a NAND element 26 is enabled via inverters 28, 29 to transfer the RDAT signal supplied thereto as a third input via the line 18. The RDAT signal is transferred via a NAND element 32 and inverter 33 to the data recovery circuits via an input line 36. During selected time periods of normal operation when the data recovery circuits are dormant, i.e., not being utilized for a read operation with the storage device 10, the mode control generator 22 may enable the data selection circuits 20 to supply a data bit string from an alternate source for test purposes.

A test code generator 40 supplies data bit strings MFM and MFMJ for testing the data recovery circuits of the storage controller. The TMFM1 signal from mode control generator 22 enables the MFM signal bit string onto the input line 36 by enabling a NAND element 42; the TMFMJ signal enables the MFMJ bit string via a NAND element 44. When either of the test signals TMFM1 or TMFMJ are enabled the RDAT NAND element 26 is disabled by a signal from the corresponding inverter 28, 29. Similarly, the TMFM1 signal disables the MFMJ NAND element 44 via the inverter 28, and the TMFMJ signal disables the MFM NAND element 42 via the inverter 29. Thus, only one bit string may be gated through NAND element 32 at one time.

It is believed unnecessary for the practice of my invention to disclose the detailed operation of the data recovery circuits; however, a brief description of exemplary recovery circuits is presented to enable one skilled in the art to understand the environment in which the present invention may be placed. Data recorded on cyclic store devices such as the storage device 10 is arranged in groups of machine words called blocks. During the write operation, certain digits not used to represent data are generated by the store control unit and included in each block of data. These special digits, termed gap digits, are control items utilized for storage management and device control; the gap digits may take various formats depending on the particular type of device and the control means utilized for storing information on the device and retrieving it therefrom. A useful reference describing some gap formats and their use in a disk subsystem is, *Peripheral Devices*, by Ivan Flores, 1973, Prentice-Hall, Inc., page 375 et seq.

The data recovery circuits of FIG. 1 comprise a voltage-controlled oscillator (VCO) 46, feedback circuits 48, data separation circuits 50 and phase detector circuits 52. The VCO 46, feedback path 48, and a phase detector such as a servo phase detector (SPD) 54 form a phase-locked oscillator (PLO) which generates a timing signal TVCO on output line 56. The TVCO signal is phase-locked at a basic frequency of the storage and retrieval system by detecting any difference in phase which may exist between an input signal and the TVCO output signal, and adjusting the VCO 46 frequency accordingly.

The basic frequency of the presently described embodiment is approximately 14.2 MHz.

The mode of operation of the data-recovery circuits is dependent on the type of input signal being sensed. Three modes of operation are extant in the data recovery circuits of FIG. 1: these are termed servo, fast lock and normal modes. Servo mode is enabled during a write operation in order to slave the timing of the data being written onto the data track 14 as closely as possible to the actual speed of the disk drive as reflected by the timing marks of a clock track 62. During a read operation the timing inherent in the data is extracted therefrom; consequently, at the beginning of a read operation the data recovery circuits are switched from servo mode to fast lock mode. During fast lock read, a PLO sync item is included with the gap digits of the records written on the data track 14. One example of such a sync item which may be detected during fast lock mode is a predetermined number of contiguous 0's. Such a signal provides a single-phase signal at the basic frequency of the data which may be locked onto by the PLO more rapidly than the normal data signal which is multiphase. Other examples of PLO sync item formats are shown in the previously referenced title. After the predetermined number of PLO sync digits have been sensed, the PLO if operating properly will generate VCO clock signals on output line 56 at a basic frequency of the self-clocking data signals, and the mode of operation is switched from fast lock to normal mode for sensing the subsequent data signals.

A separate phase detector is associated with each of the three modes of operation. The servo phase detector 54 receives a servo signal from the RSP 16 via the data selection circuits 20. Servo timing marks are sensed by a magnetic transducer 60 from the clock track 62 of the storage unit 10. The servo signal in the presently described embodiment has a period of approximately 1.13 microseconds; it is transferred via a NAND element 64 of the data selection circuits 20 to the servo phase detector 54 under control of a servo select signal SS from the mode control logic 22. The SS signal is enabled whenever a device such as the device 10 is selected and is in the servo mode. When no device is selected, or during circuit test, the SS signal is disabled and a simulated servo signal DO4 is transferred from the test code generator 40 via a NAND element 66 to an input line 68 of the servo phase detector 54. Another input line 70 of servo phase detector 54 receives a VCO/16 signal from a binary counter 72 in the feedback loop of the phase-locked oscillator.

Referring still to FIG. 1, the input data signal on line 36 traverses a tapped delay line 74. A plurality of output taps of the delay line 74 are labeled, respectively, 3, 9, 15, 21, and 27, to indicate a delay in nanoseconds for each tap. During fast lock mode, the input signal on line 36 is delayed 21 nanoseconds and applied to an input 76 of a fast-lock phase detector (FPD). The increments of delay of the delay line 74 are arbitrary. Specific delays are chosen to optimize the position of the TVCO timing signal on line 56, positioning it accurately with respect to input data bit transitions. The binary counter 72 comprising bistables FV1-4 supplies a VCO/2 feedback signal from bistable FV1 to a second input 80 of the phase detector 78. Fast lock mode is enabled by a control signal FSYN transferred from the mode control logic 22 via a line 82 to a multiplexer 84. The multiplexer 84 is responsive to the enabled FSYN signal to transfer the output signals of the fast lock phase detector 78 to the input of the VCO 46. The multiplexer 84 is further responsive to a RSYN readsync signal received from the mode control logic 22 via a line 86 to transfer the output signals of a normal-lock phase detector (NPD) 88 through the multiplexer 84 to the VCO 46. When neither the FSYN nor RSYN signal is enabled, the output of the servo phase detector 54 is enabled to the VCO 46. The mode control logic 22 receives control information from the gap digits of the input data string via a line 89 and control signals CS from an external source (not shown), e.g., a store subsystem microprocessor, a central system, or the like.

The normal-lock phase detector 88 receives the data input signal delayed via taps 9 and 27 of the delay line 74, the taps 9 and 27 forming a time window during which an MFM data transition may be expected to occur. The input signals from taps 9 and 27 are compared, respectively, with the TVCO timing signal from the VCO 46 and its complement generated by an inverter 90.

Figure 3:
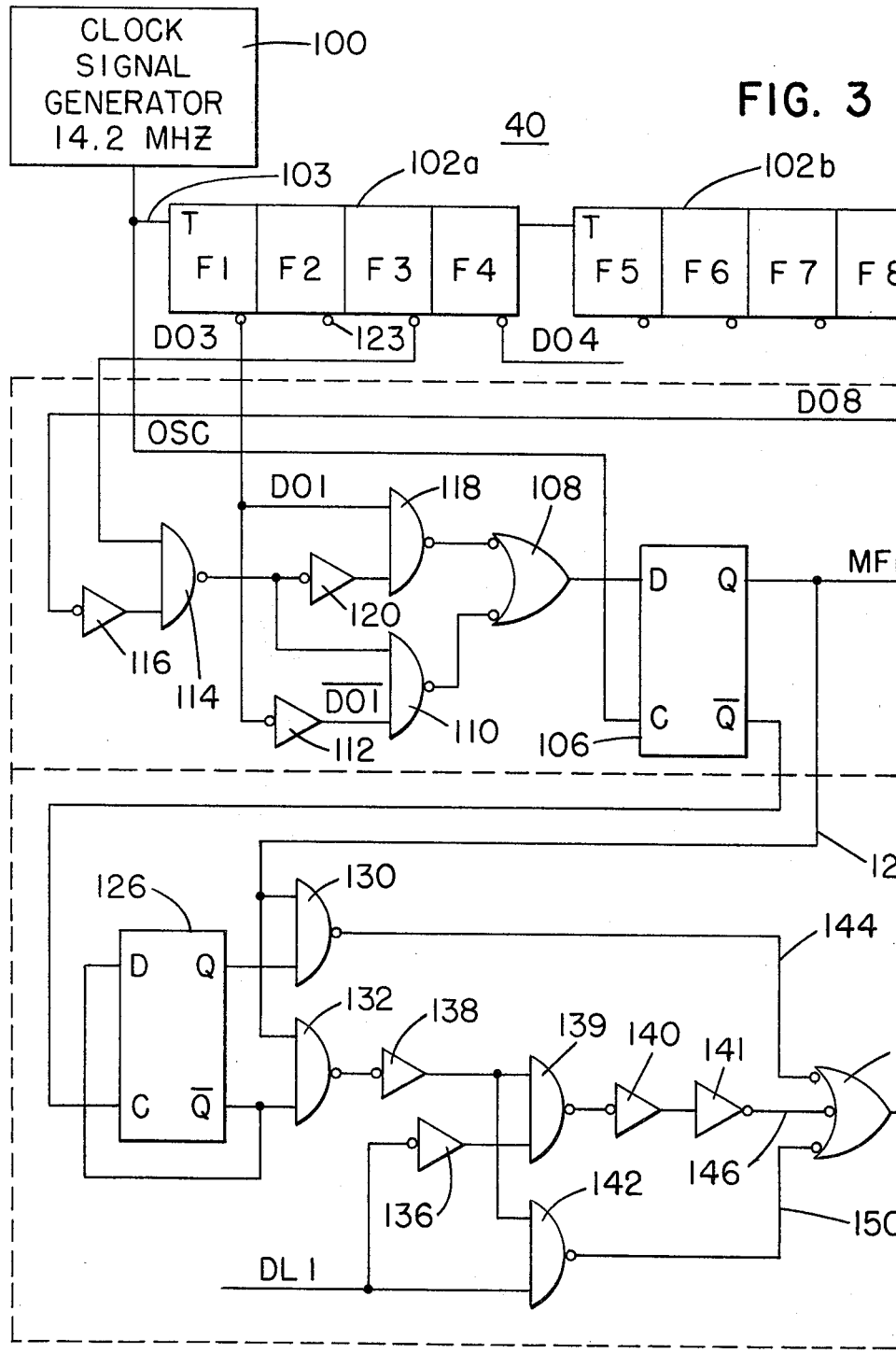
FIG. 3 is a logic diagram of the test code generator of the present invention.

Referring now to FIG. 3, a schematic diagram of one embodiment of the test code generator 40 of FIG. 1 is shown. A free-running clock signal generator 100 produces OSC clock signals from which all timing functions for the test code generator 40 are derived. The OSC signal is a symmetrical waveform having a period of 70.4 nanoseconds. A conventional binary counter 102 comprising bistables F1-F8 is shown in FIG. 3 as two modules 102a and 102b, each module having four bistables. The binary counter 102 receives the train of OSC pulses via a line 103 and in response thereto generates output signals DO1-DO8. Although an 8-bit binary counter is described, a counter having more stages may be utilized, as will be shown in the ensuing discussion. A longer MFM-coded bit-string may be desired than that which may be generated utilizing an 8-bit counter. The numeric designation of each of the binary counter output signals DO1-DO8 conveniently denotes the relationship by power of 2 between the period of the input clock signal and the period of the respective output signal. For example, the period of the DO3 signal is 70.4 nsec $\times 2^3 = 563$ nsec.

MFM encoding logic 104 receives inputs from the clock signal generator and the binary counter 102. Referring still to FIG. 3 in conjunction with the timing diagram FIG. 4, the OSC clock signal applied to the clock input C of an MFM bistable 106 switches the bistable 106 at time t1, when an enabling signal is applied to the D input terminal from a NAND element 108. The bistable 106 responds to a positive transition of the clock signal at the C input terminal to change the state of the Q and $\overline{Q}$ output terminals, if the signal at the D input terminal is the same state as the $\overline{Q}$ output terminal, a well-known relationship for a D-type bistable. When the DO8 signal is high the NAND element 108 follows the excursions of the $\overline{DO1}$ signal via a NAND element 110 and inverter 112. The NAND element 110 is enabled by the DO8 signal via a NAND element 114 and inverter 116. Referring to FIG. 4, the MFM waveform generated at the Q output terminal of bistable 106 is shown in relation to data cell boundries indicated by dashed lines each two periods of the OSC clock signal. The positive excursion of the MFM signal at $t1$, during the first half of the bit cell, is representative of a binary 0 as previously described with reference to FIG. 2. The MFM bistable is reset by the next OSC clock signal at time $t2$ when the D input is low. The MFM bistable continues to toggle thus each bit period, producing a series of binary 0's until the DO8 signal goes low at time t3. After time $t3$ the D input to MFM bistable 106 is controlled alternately by NAND elements 110 and 118 in response to the output signal of NAND element 114. When DO3 is low, NAND element 110 is enabled by the high output of NAND element 114 and NAND element 108 continues to follow the excursions of $\overline{DO1}$. when the DO3 signal is high, the low output of NAND element 114 enables NAND element 108 via NAND element 118 and inverter 120. NAND element 108 therefore follows the excursions of the DO1 signal when DO3 is high, and the MFM bistable 106 toggles positively during the second half of the bit cell. In accordance with the MFM encoding technique there is no positive excursion of the MFM signal during a 0 bit cell which follows a 1 bit cell, as for example at time $t4$, FIG. 4.

The MFM encoding logic 104 of the presently described embodiment produces a string of 0 bits for approximately 9 microseconds or 64 bit periods, while the DO8 signal is high. When DO8 signal is low, the MFM encoding logic generates a string of alternating pairs of 1's and 0's, again for 64 bit periods. Machine words commonly comprise groups of bits termed syllables or bytes, e.g., 8-bit bytes each having two hexidecimal coded binary characters. FIG. 4 illustrates by reference numerals 120 the selection of a byte boundry delineating such an organization for the MFM signal. Organized thusly, the output signal of the MFM encoding logic 140 generates a data string comprising seven bytes of hexidecimal zeros (designated herein $(00)_{16}$), followed by one byte of $(19)_{16}$ as shown in FIG. 4, and 8 bytes of data consisting of, $(99)_{16}$. . . $(99)_{16}$ $(80)_{16}$. This pattern is particularly useful because it simulates the format of a short machine record having gap digits comprising a PLO sync item followed by a sync byte and a data item. The $(19)_{16}$ byte represents the sync byte, and the subsequent $(99)_{16}$. . ., represents the data. It should be noted for this organization that the string of zeros forming the PLO sync item may consist of 8 bytes of $(00)_{16}$ less one 0 bit.

Another organization for the same data pattern is shown on FIG. 4 by byte boundries 121. In this organization the MFM encoding logic 104 generates 8 $(00)_{16}$ bytes followed by 8 $(CC)_{16}$ bytes. In view of the foregoing, it is evident that selection of a particular organization of a data string is arbitrary within the confines of the bit pattern generated by the encoding logic. With the teachings of the present invention in mind it is further evident that other bit patterns may be generated by altering the encoding logic to satisfy another configurations, as for example, the machine record configurations shown in the previously referenced title. A counter such as the counter 102 with one more stage F9 would provide a DO9 signal for generating an encoded bit string having thirty two syllables or bytes instead of the sixteen byte signal described herein. Other outputs of the counter 102 may be utilized to provide alternate bit patterns of the MFM signal, e.g., the DO2 signal from terminal 123 may be utilized to change the pattern from 1 to 0 or vice versa every bit cell instead of every other bit cell as with the DO3 signal of the described embodiment.

The MFM signal may be selected as an input data signal to the data recovery circuits as previously described with reference to FIG. 1. The predetermined quality of the MFM test signal, i.e., a signal free of peak shift, dropouts, and other degradations which might be introduced by a storage device providing a test signal, is advantageous in comparing signals of doubtful quality from a plurality of sources with a known standard. In order to test the data recovery circuits of the storage controller with a known signal having precisely predetermined degradations, the test code generator of FIG. 3 includes means for introducing a predetermined amount of jitter into the MFM signal to produce a worst-case data pattern.

Referring to FIG. 3, jitter logic 124 includes a bit-select bistable 126 having an input signal applied at the clock terminal C thereof from the $\overline{Q}$ output terminal of the MFM bistable 106. The MFM signal is applied via line 128 to one input terminal of each of two NAND elements 130, 132. When the Q output terminal of the bistable 126 is high, the corresponding MFM bit is gated through an output NAND element 134 via NAND element 130. When the $\overline{Q}$ output terminal of the bistable 126 is high and a DL1 signal applied to NAND element 139 via an inverter 136 is low, the corresponding MFM bit is gated through the output NAND element 134 via the NAND element 132 and intermediate logic elements 138–141. Two different paths 144, 146 are thus selected for regeneration of alternate bits of the MFM signal as an MFMJ signal on output line 148. One path 144 has only two gate delays; the other path 146, six gate delays. The difference in delay in the presently described embodiment is about 30 nanoseconds, which is greater than the skew which exists in the signals supplied by most storage devices. The MFMJ signal thus provides a predetermined worst-case data pattern for testing the data recovery circuits of the storage controller.

Referring to FIG. 5, the MFMJ signal is shown in relation to the MFM signal and the Q output signal of the bit-select bistable 126. It is apparent that alternate bits are delayed via the path 146 (FIG. 3). An adjustment of the bit boundries (which are transparent to the hardware) shows in FIG. 5 that the MFMJ signal presents a bit string having a precisely predetermined skew between adjacent bits of the string. Each of the bits of the MFMJ signal (except the "absent" bit) is labeled with a prefix character L denoting late or E denoting early. It can be seen from FIG. 5 that the low to high transitions of the 0 bits of the MFMJ signal no longer occur at the center of the first half of each bit cell, but instead occur late and then early with respect to the center of the corresponding bit cell.

The DL1 signal generated by the mode control logic 22 (FIG. 1) provides a means for selecting another quantity of delay by routing alternate bits of the MFM signal via a path 150 having four gate delays, viz: logic elements 132, 138, 142 and 134.

Returning now to FIG. 1, the data separation circuits 50 include a window signal bistable 160 receiving a clock signal input via a line 162 from a tapped delay line 164. The clock signal on line 162 is the TVCO timing signal delayed 27 nanoseconds. The delay is chosen to provide a signal at the Q output of the bistable 160, the center of which signal occurs at or near alternate positive excursion of the TVCO clock signal. The Q output of bistable 160 is high during the second half of a bit cell; the Q output is high during the first half of the same bit cell. The Q output of bistable 160 on line 166 thus provides a window signal occurring during that portion of a bit cell when a 1 signal transition may be expected to occur. By selecting an appropriate tap of the delay line 74 such as the tap 15 and applying the delayed data signal generated at that tap to the clock signal input of a data selection bistable 168, the bistable 168 will change state in response to a positive going transition at the C terminal when the window signal on the line 166 is high. The bistable 168 will not respond to a positive transition of the data input signal occurring during the first half of the bit cell and thus "looks" only for 1 bits. A signal for resetting the data selection bistable 168 is generated by a NAND element 169 just prior to the generation of the enabling signal applied to the D-input via line 166. The TVCO clock signal at tap 17 of the delay line 164 enables the reset NAND element 169 via an inverter 171 prior to clocking the window signal bistable 160 with the same TVCO signal delayed to tap 27 and applied via line 162 to the C input of the bistable 160.

A bistable 170 buffers the data bits detected by the bistable 168 prior to transferring the detected data to external circuits (not shown) via a DATA OUT line 172. A reset circuit comprising a NAND element 174 and inverter 176 provides a signal via a line 178 for resetting the window signal bistable 160 during fast lock mode in preparation for detecting 0 bits. Although the signal on DATA OUT line provides a representation of both 1 and 0 bits, 0 bit detection logic 180 is provided in the presently described embodiment. The 0 bit detection logic 180 is utilized, particularly, for detecting strings of 0's during fast lock mode. The operation of the 0 bit detection logic 180 is similar to the 1 bit detection logic comprising bistables 168, 170, and need not be explained in detail.

The data detection circuits 50 of FIG. 1 do not form a part of the present invention but are disclosed herein to describe one environment in which the present invention may be placed. Reference is made to my aforementioned copending application for a complete exposition of the data separation circuits of FIG. 1.

I have described herein a test code generator for providing a self-clocking data string to data separation circuits of a data retrieval system. The test data string may be an ideal signal having virtually no degradations like those generated by conventional storage devices. Alternatively, the test data string may provide a worst-case signal having a data pattern with precisely predetermined degradations in the form of skew or phase shift of the data bits. The manner in which the data separation circuits respond to the degraded test signal provides an exacting measure of the ability of the data separation circuits to function under predetermined, marginal conditions. The test code generator allows "on line" testing of both the data separation circuits of the storage subsystem controller, and testing by comparison of individual storage devices, thus greatly reducing the requirement for preventive-maintenance testing performed by service personnel. Apparatus for comparing the predetermined test pattern with the pattern of recovered data is well known in the art.

From the foregoing detailed description it will be appreciated that the previously stated objects and advantages, as well as other apparent from this specification have been achieved by the embodiment described herein. Obviously, modifications and variations of my invention are possible in the light of the above teachings. It is therefore understood that my invention may be practiced otherwise than is specifically described and it is intended by the appended claims to cover all such modifications of the invention which fall within the true spirit of the scope of the invention.

What is claimed is:

1. A test code generator, comprising:
    timing means for generating clock signals having a basic period;
    means coupled to said timing means for counting the clock signals, said counting means generating a plurality of output signals each having a period which is a $2^n$ multiple of the basic period
    means coupled to both said timing means and said counting means and responsive to selected ones of the plurality of output signals for generating a series of self-clocking binary digits having a period at least twice the basic period, the series of binary digits being representative of a predetermined test code.

2. A test code generator as claimed in claim 1, further comprising:
    means coupled to said code generating means for delaying selected ones of the series of binary digits to produce a predetermined phase shift of the selected digits with respect to other digits of the series.

3. A test code generator as claimed in claim 2, wherein said delaying means includes means for delaying alternate ones of the series of binary digits.

4. A test code generator for simulating a string of self-clocking data recovered from a dynamic magnetic storage medium, comprising:
    timing means for generating clock signals having a basic period;
    counting means coupled to said timing means and responsive to the clock signals for generating a plurality of control signals; and
    means coupled to said timing means for encoding a string of digits, said encoding means including means responsive to one of the plurality of control signals for generating a signal of the string representative of one digit, the generating means further responsive to a complement of the one control signal for generating a signal of the string representative of another digit, said encoding means further including first means responsive to a first selected one of the plurality of control signals for enabling the one digit generating means for at least one bit period, and second means responsive to a second selected one of the plurality of control signal for enabling the other digit generating means for another at least one bit period.

5. A test code generator as claimed in claim 4, wherein the second selected one of the plurality of control signals is a complement of the first selected one of the plurality of control signals.

6. A test code generator as claimed in claim 4, further comprising:
    means coupled to said encoding means for delaying selected ones of the string of digits.

7. A test code generator as claimed in claim 6, wherein said delaying means includes means for delaying alternate ones of the string of digits.

8. A test code generator for simulating a string of self-clocking data recovered from a dynamic magnetic storage medium, comprising:
    timing means for generating clock signals having a basic period;
    counting means coupled to said timing means and responsive to the clock signals for generating a plurality of control signals each having a period which is a different $2^n$ multiple of the basic period; and
    means coupled to said timing means for encoding a string of binary digits, said encoding means including
    means responsive to one of the plurality of control signals for generating one binary digit of the string, the generating means further responsive to a complement of the one control signal for generating another binary digit of the string,
    said encoding means further including first means responsive to a first one of the plurality of control signals for enabling the one binary digit generating means for at least one bit period,
    second means responsive to a second one of the plurality of control signals for enabling the other binary digit generating means for another at least one bit period.
    third means responsive to a third one of the plurality of control signals for controlling the first and second enabling means to generate a sync item portion of the string of binary digits, and fourth means responsive to a fourth one of the plurality of control signals for controlling the first and second enabling means to generate a date item portion of the string of binary digits.

9. A test code generator as claimed in claim 8, wherein the fourth one of the plurality of control signals is a complement of the third one of the plurality of control signals.

10. A test code generator as claimed in claim 8, further comprising: means coupled to said encoding means for delaying selected ones of the string of binary digits.

11. A test code generator as claimed in claim 10, wherein said delaying means includes means for delaying alternate ones of the string of binary data.

12. A test code generator as claimed in claim 10, wherein said delaying means includes means for selectively altering the amount of delay.

* * * * *

UNITED STATES PATENT OFFICE
CERTIFICATE OF CORRECTION

Patent No. 3,996,612            Dated December 7, 1976

Inventor(s) Charles J. Fassbender

It is certified that error appears in the above-identified patent and that said Letters Patent are hereby corrected as shown below:

Claim 8,

Column 11, Line 4, delete "date" and instead insert -- data --.

Signed and Sealed this

Fifth Day of April 1977

[SEAL]

Attest:

RUTH C. MASON
*Attesting Officer*

C. MARSHALL DANN
*Commissioner of Patents and Trademarks*